United States Patent
Saenger et al.

(10) Patent No.: US 9,323,156 B2
(45) Date of Patent: Apr. 26, 2016

(54) OPTICAL SYSTEM OF A MICROLITHOGRAPHIC PROJECTION EXPOSURE APPARATUS

(71) Applicant: Carl Zeiss SMT GmbH, Oberkochen (DE)

(72) Inventors: Ingo Saenger, Heidenheim (DE); Olaf Dittmann, Bopfingen (DE); Joerg Zimmermann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 684 days.

(21) Appl. No.: 13/661,381

(22) Filed: Oct. 26, 2012

(65) Prior Publication Data

US 2013/0050673 A1 Feb. 28, 2013

Related U.S. Application Data

(63) Continuation of application No. PCT/EP2011/058040, filed on May 18, 2011.

(60) Provisional application No. 61/353,250, filed on Jun. 10, 2010.

(30) Foreign Application Priority Data

Jun. 10, 2010 (DE) .......................... 10 2010 029 905

(51) Int. Cl.
*G03B 27/54* (2006.01)
*G03F 7/20* (2006.01)

(52) U.S. Cl.
CPC ........ *G03F 7/70116* (2013.01); *G03F 7/70566* (2013.01)

(58) Field of Classification Search
CPC .................. G03F 7/70566; G03F 7/70116
USPC ..................................... 355/67, 53
See application file for complete search history.

(56) References Cited

U.S. PATENT DOCUMENTS

| 6,191,880 B1 | 2/2001 | Schuster |
| 8,077,289 B2 | 12/2011 | Fiolka |
| 8,817,235 B2 | 8/2014 | Tinnemans et al. |
| 2004/0169923 A1 | 9/2004 | Hug |

(Continued)

FOREIGN PATENT DOCUMENTS

| CN | 102200693 A | 9/2011 |
| DE | 10 2004 011 733 A1 | 9/2005 |

(Continued)

OTHER PUBLICATIONS

Japanese Office Action, with translation thereof, for corresponding JP Appl No. 2013-513603, dated Jan. 22, 2014.

(Continued)

*Primary Examiner* — Peter B Kim
(74) *Attorney, Agent, or Firm* — Fish & Richardson P.C.

(57) ABSTRACT

An optical system of a microlithographic projection exposure apparatus includes at least one mirror arrangement having a plurality of mirror elements which are displaceable independently of each other for altering an angular distribution of the light reflected by the mirror arrangement. The optical system also includes a polarization-influencing optical arrangement including a first lambda/2 plate and at least one additional lambda/2 plate.

23 Claims, 11 Drawing Sheets

(56) References Cited

U.S. PATENT DOCUMENTS

| | | | |
|---|---|---|---|
| 2005/0057632 A1 | 3/2005 | Sunagawa | |
| 2007/0019179 A1* | 1/2007 | Fiolka et al. | 355/71 |
| 2007/0081114 A1 | 4/2007 | Fiolka et al. | |
| 2007/0146676 A1 | 6/2007 | Tanitsu | |
| 2007/0188730 A1 | 8/2007 | Takeuchi et al. | |
| 2007/0195305 A1 | 8/2007 | Mulder et al. | |
| 2007/0279613 A1 | 12/2007 | Fiolka et al. | |
| 2008/0259300 A1* | 10/2008 | Klaassen et al. | 355/53 |
| 2009/0195766 A1* | 8/2009 | Dieckmann et al. | 355/71 |
| 2011/0063597 A1 | 3/2011 | Mengel | |
| 2011/0122382 A1 | 5/2011 | Fiolka | |
| 2011/0194093 A1 | 8/2011 | Saenger | |
| 2011/0228247 A1* | 9/2011 | Mulder | G03F 7/70116 355/71 |
| 2012/0075605 A1 | 3/2012 | Chen | |

FOREIGN PATENT DOCUMENTS

| | | |
|---|---|---|
| DE | 10 2008 009 601 A1 | 8/2009 |
| DE | 10 2008 040 611 A1 | 1/2010 |
| EP | 1 681 710 | 7/2006 |
| EP | 1 826 616 A2 | 8/2007 |
| GB | 1 340 347 | 12/1973 |
| JP | 2005-091539 | 4/2005 |
| JP | 2007-220767 | 8/2007 |
| JP | 2007-227918 | 9/2007 |
| JP | 2007-527549 | 9/2007 |
| JP | 2009-510794 | 3/2009 |
| JP | 2009-272624 | 11/2009 |
| JP | 2011-164626 | 8/2011 |
| JP | 2011-56066 | 10/2011 |
| JP | 2012-069945 | 4/2012 |
| WO | WO 2005/026843 | 3/2005 |
| WO | WO 2005/031467 A2 | 4/2005 |
| WO | WO 2005/069081 A2 | 7/2005 |
| WO | WO 2008/019936 | 2/2008 |
| WO | WO 2009/034109 A2 | 3/2009 |
| WO | WO 2009/054541 A2 | 4/2009 |
| WO | WO 2009/100862 A1 | 8/2009 |
| WO | WO 2010009788 A1 * | 1/2010 |

OTHER PUBLICATIONS

Taiwanese Office Action, with translation, for TW Appl No. 100119953, dated Feb. 27, 2014.
The International Search Report and Written Opinion for corresponding PCT Appl No. PCT/EP2011/058040, dated Jul. 22, 2011.
The International Preliminary Report on Patentability for corresponding PCT Appl No. PCT/EP2011/058040, dated Dec. 10, 2012.
Taiwanese Office Action, with translation, for corresponding TW Application No. 100119953, dated Sep. 24, 2013.
German Office Action, with English translation, for corresponding DE Appl No. 10 2010 029 905.7-51, dated Feb. 10, 2011.
The European Office Action for corresponding EP Appl No. 11723898.0-1553, dated Jan. 6, 2014.
Japanese Office Action, with translation, for JP Application No. 2013-513603, dated Sep. 2, 2014.
Chinese Office Action, with translation thereof, for CN Appl No. 201180028501.5, dated May 22, 2014.
Korean Office Action, with translation thereof, for KR Appl No. 10-2012-7032275, dated May 24, 2014.

* cited by examiner

OPTICAL SYSTEM OF A MICROLITHOGRAPHIC PROJECTION EXPOSURE APPARATUS

CROSS REFERENCE TO RELATED APPLICATIONS

This application is a continuation of, and claims benefit under 35 USC 120 to, international application PCT/EP2011/058040, filed May 18, 2011, which claims benefit under 35 USC 119 of German Application No. 10 2010 029 905.7, filed Jun. 10, 2010 and under 35 USC 119(e) of U.S. Ser. No. 61/353,250, filed Jun. 10, 2010. International application PCT/EP2011/058040 is hereby incorporated by reference in its entirety.

FIELD

The disclosure concerns an optical system of a microlithographic projection exposure apparatus. In particular the disclosure concerns an optical system of a microlithographic projection exposure apparatus which permits enhanced flexibility in the provision of a desired polarization distribution.

BACKGROUND

Microlithography is used for the production of microstructured components such as for example integrated circuits or LCDs. The microlithography process is performed in a so-called projection exposure apparatus which has an illumination system and a projection objective. The image of a mask (=reticle) illuminated via the illumination system is projected via the projection objective on to a substrate (for example a silicon wafer) which is coated with a light-sensitive layer (photoresist) and arranged in the image plane of the projection objective to transfer the mask structure on to the light-sensitive coating on the substrate.

In operation of a microlithographic projection exposure apparatus it is desirable to set defined illumination settings, that is to say intensity distributions in a pupil plane of the illumination system, in specifically targeted fashion. For that purpose, besides the use of diffractive optical elements (so-called DOEs), the use of mirror arrangements is also known, for example from WO 2005/026843 A2. Such mirror arrangements include a plurality of micromirrors adjustable independently of each other.

Various approaches are also known for setting given polarization distributions in the pupil plane and/or in the reticle in the illumination system for optimizing imaging contrast, in specifically targeted fashion. Examples are disclosed in, for example, WO 2005/069081 A2, WO 2005/031467 A2, U.S. Pat. No. 6,191,880 B1, US 2007/0146676 A1, WO 2009/034109 A2, WO 2008/019936 A2, WO 2009/100862 A1, DE 10 2008 009 601 A1 and DE 10 2004 011 733 A1.

In particular it is known both in the illumination system and also in the projection objective for a tangential polarization distribution to be set for high-contrast imaging. The expression "tangential polarization" (or "TE polarization") is used to denote a polarization distribution in which the vibration planes of the electric field strength vectors of the individual, linearly polarized light beams are oriented approximately perpendicularly to the radius directed towards the optical system axis. In contrast the expression "radial polarization" (or "TM polarization") is used to denote a polarization distribution in which the vibration planes of the electric field strength vectors of the individual, linearly polarized light beams are oriented approximately radially with respect to the optical system axis.

SUMMARY

The disclosure provides a polarization-influencing optical arrangement and an optical system of a microlithographic projection exposure apparatus, which permit enhanced flexibility in the provision of a desired polarization distribution.

In one aspect, an optical system of a microlithographic projection exposure apparatus includes:
- at least one mirror arrangement having a plurality of mirror elements which are displaceable independently of each other for altering an angular distribution of the light reflected by the mirror arrangement; and
- a polarization-influencing optical arrangement including a first lambda/2 plate and at least one second lambda/2 plate.

The disclosure is based in particular on the concept, by using at least two lambda/2 plates in combination with a mirror arrangement, of providing at least two regions which, on the through-passage of light, produce different initial polarization distributions in dependence on whether the light passes through only one of the lambda/2 plates, through both lambda/2 plates or through none of the lambda/2 plates, in conjunction with the mirror arrangement. The disclosure thus affords the possibility, for example when using two lambda/2 plates, of producing four different polarization states with freely selectable light or intensity proportions.

Studies have shown that it is already possible to take account to a quite great extent the influence of the polarization properties in terms of the imaging properties with the four polarization states which can be set by partial overlapping of two lambda/2 plates. In that case for example by relative displacement of the two lambda/2 plates (which can be displaceable for example in the x- and y-directions), it is at the same time also possible to vary the relative proportions in respect of overall intensity (that is to say for example 80% x-polarized light and 20% y-polarized light and so forth).

The flexible setting of different polarization distributions or illumination settings, which is made possible in accordance with the disclosure in a projection exposure apparatus, can be effected in particular without requiring additional optical components, which reduces structural complication and expenditure as well as the costs for example for a lithography process. In addition a transmission loss which is entailed with a use of additional optical components is also avoided.

In an embodiment, the lambda/2 plates are arranged in succession in the optical system with respect to the light propagation direction.

In an embodiment, the lambda/2 plates are displaceable in their relative position with respect to each other. In particular, the lambda/2 plates can have a variable degree of overlap in the light propagation direction. Thus, by a variation in the degree of overlap of at least two lambda/2 plates, in conjunction with the mirror arrangement, it is possible to flexibly set mutually different polarized illumination settings without the polarization-influencing optical arrangement having to be exchanged for the change between those illumination settings.

The displaceability of the lambda/2 plates in their relative position with respect to each other can include a translatory displacement of at least one of the lambda/2 plates and/or a rotation of at least one of the lambda/2 plates. In the last-mentioned case possibly only the relative position of the respective fast axes is altered, which is also interpreted in accordance with the present disclosure as relative displacement of the lambda/2 plates with respect to each other.

In an embodiment, the first lambda/2 plate and/or the second lambda/2 plate are displaceable between a first position in which the respective lambda/2 plate is completely outside the optically effective region of the mirror arrangement and a second position in which the respective lambda/2 plate is disposed completely within the optically effective region of the mirror arrangement. In that way therefore the respective lambda/2 plate, depending on the desired polarization distribution, can also be moved completely out of the optically effective region of the mirror arrangement, whereby the flexibility of the overall system is further increased in providing a desired polarization distribution. In that respect, the criterion whereby the respective lambda/2 plate is disposed within the optically effective region of the mirror arrangement is used to denote an arrangement in which, in operation of the optical system, all light rays passing through the lambda/2 plate are also reflected by the mirror arrangement. Accordingly an arrangement of the respective lambda/2 plate outside the optically effective region of the mirror arrangement signifies that light rays reflected by the mirror arrangement do not pass through the respective lambda/2 plate.

The disclosure is not limited to lambda/2 plates which are displaceable relative to each other. Thus, as is also described in greater detail hereinafter, differently polarized illumination settings can already be set with a static implementation of the lambda/2 plates, utilising the displaceability of the mirror elements of the mirror arrangement.

The arrangement according to the disclosure can in particular be so set that only the first lambda/2 plate is disposed in a first non-overlap region while only the second lambda/2 plate is disposed in a second non-overlap region.

In an embodiment the first lambda/2 plate has a first fast axis of birefringence and the second lambda/2 plate has a second fast axis of birefringence, the orientations of the first axis and the second axis being different from each other.

In an embodiment, the first fast axis and the second fast axis are arranged at an angle of 45°±5° relative to each other.

In an embodiment, the first fast axis extends at an angle of 22.5°±2° relative to the preferential polarization direction of a light beam incident on the arrangement and the second fast axis extends at an angle of −22.5°±2° relative to the preferential polarization direction of a light beam incident on the arrangement.

In an embodiment, the vibration plane of a first linearly polarized light beam which passes only through the first lambda/2 plate is rotated through a first rotary angle and the vibration plane of a second linearly polarized light beam which passes only through the second lambda/2 plate is rotated through a second rotary angle, the first rotary angle being different from the second rotary angle.

In an embodiment, the first rotary angle and the second rotary angle are the same in terms of quantity and are of opposite signs.

In an embodiment, the first lambda/2 plate and the second lambda/2 plate form a 90° rotator in an overlap region with each other.

In an embodiment, the polarization-influencing optical arrangement has precisely two lambda/2 plates. With the implementation of a particularly simple structure, that makes use of the fact that it is already possible to take account to a quite great extent of the influence of the polarization properties in terms of the imaging properties, with only two lambda/2 plates, as a consequence of the four polarization states which are adjustable thereby as described hereinbefore.

In an embodiment the polarization-influencing optical arrangement has at least three and preferably at least seven lambda/2 plates. An arrangement with at least three lambda/2 plates has the advantage that it is possible to dispense with displaceability or adjustability of the lambda/2 plates in mutually different (in particular mutually perpendicular) directions, for example in the x- and y-directions, and it is already possible to achieve a high level of flexibility in terms of setting different polarization distributions with displaceability of the lambda/2 plates along a common direction (for example in the x-direction).

In an embodiment the polarization-influencing optical arrangement is adjustable in such a way that in combination with the mirror arrangement in operation of the optical system it converts a linear polarization distribution with a preferential polarization direction which is constant over the light beam cross-section, of a light beam incident on the arrangement, into an approximately tangential polarization distribution.

In a further aspect the disclosure concerns a microlithographic exposure method in which light produced by a light source of an illumination system is fed to a projection exposure apparatus for illuminating an object plane of a projection objective and in which the object plane is imaged via the projection objective into an image plane of the projection objective, wherein there is used in the illumination system
 at least one mirror arrangement having a plurality of mirror elements which are displaceable independently of each other for altering an angular distribution of the light reflected by the mirror arrangement; and
 a polarization-influencing optical arrangement including a first lambda/2 plate and at least one second lambda/2 plate.

In an embodiment at least two mutually different illumination settings are adjusted by altering the relative position of the first lambda/2 plate and the second lambda/2 plate.

In an embodiment when adjusting at least one of the illumination settings the first lambda/2 plate and the second lambda/2 plate are so arranged that they partially mutually overlap in the light propagation direction forming at least one overlap region and at least one non-overlap region.

In an embodiment for adjusting the at least one of the illumination settings both the overlap region and also the non-overlap region are at least partially illuminated.

In an embodiment at least two beam portions which are reflected by different mirror elements of the mirror arrangement and which have different polarization directions as a consequence of the action of the polarization-influencing arrangement are mutually superposed.

The disclosure further concerns a microlithographic projection exposure apparatus and a process for the microlithographic production of microstructured components.

Further configurations of the disclosure are to be found in the description and the appendant claims.

BRIEF DESCRIPTION OF THE DRAWINGS

The disclosure is described in greater detail hereinafter via embodiments by way of example illustrated in the accompanying drawings in which.

DETAILED DESCRIPTION OF PREFERRED EMBODIMENTS

Figure 1:
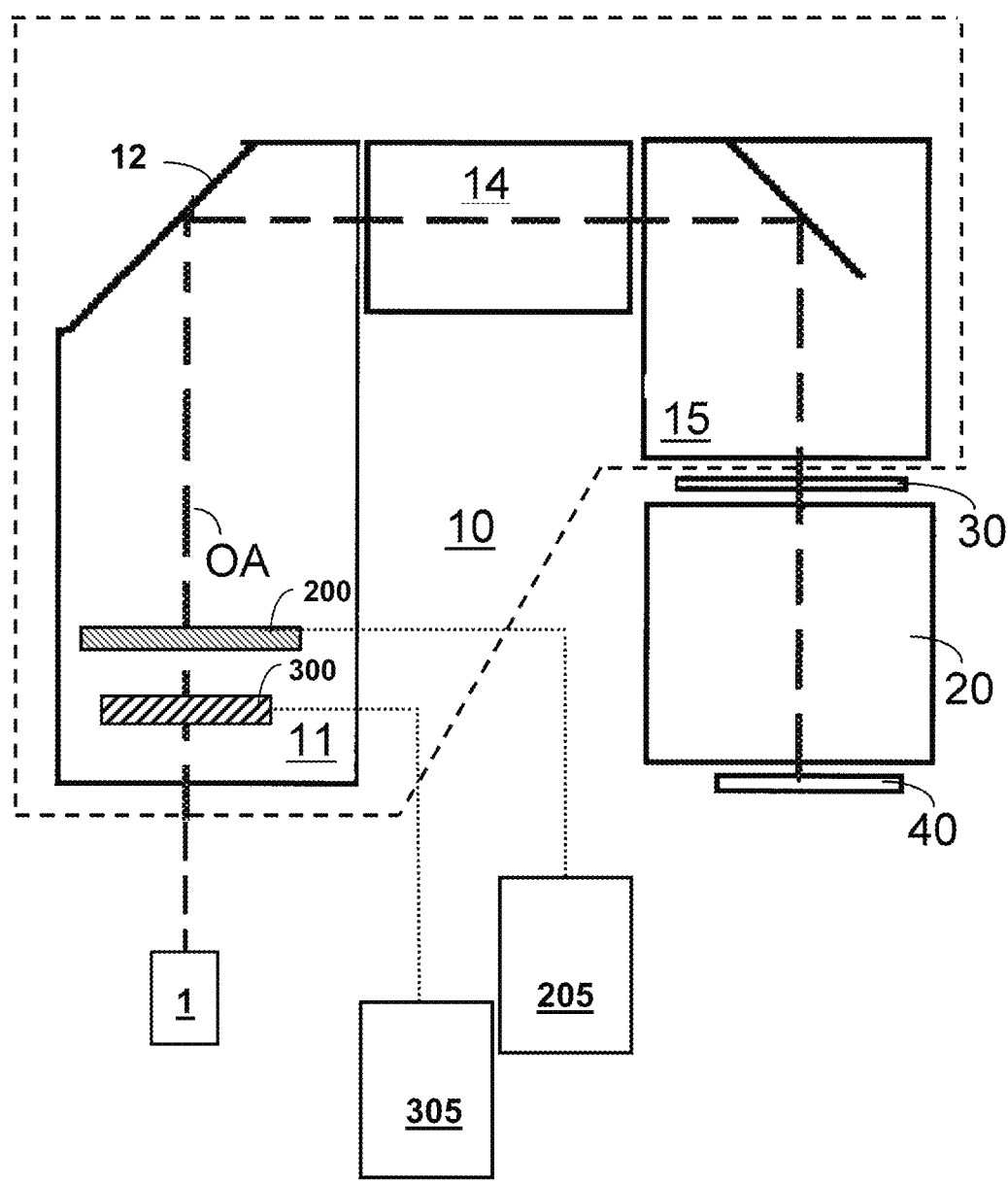
FIG. 1 shows a diagrammatic view to illustrate the structure of a microlithographic projection exposure apparatus with a polarization-influencing optical arrangement according to an embodiment of the disclosure.

A structure in principle of a microlithographic projection exposure apparatus with an optical system according to the disclosure is firstly described hereinafter with reference to FIG. 1. The projection exposure apparatus has an illumination system 10 and a projection objective 20. The illumination system 10 serves to illuminate a structure-bearing mask (reticle) 30 with light from a light source unit 1 which for example includes an ArF-excimer laser for a working wavelength of 193 nm and a beam-shaping optical arrangement producing a parallel light beam. In general the illumination system 10 and the projection objective 20 are designed preferably for a working wavelength of less than 400 nm, in particular less than 250 nm, further particularly less than 200 nm.

According to the disclosure a component part of the illumination system 10 is in particular a mirror arrangement 200 as is described in greater detail hereinafter with reference to FIG. 2. Arranged upstream of the mirror arrangement 200 in the light propagation direction is a polarization-influencing optical arrangement 300 which is described in greater detail hereinafter with reference to FIGS. 3-9. As shown in FIG. 1 there is also provided an actuation unit 305 for actuating displacement of the arrangement 300 by way of suitable actuators. Actuators for displacement of the arrangement 300 can be designed in any fashion, for example in the form of belt drives, solid-state hinge elements, piezoelectric actuators, linear drives, dc motors with or without a transmission arrangement, spindle drives, toothed belt drives, gear drives or combinations of those known components.

The illumination system 10 has an optical unit 11 which inter alia in the illustrated example includes a deflection mirror 12. Disposed downstream of the optical unit 11 in the light propagation direction, in the beam path, is a light mixing device (not shown) which for example in per se known manner can have an arrangement of micro-optical elements that is suitable for achieving light mixing, as well as a lens group 14, downstream of which is disposed a field plane having a reticle masking system (REMA) which is imaged through an REMA objective 15 disposed downstream in the light propagation direction, on to the structure-bearing mask (reticle) 30 arranged in a further field plane, and thereby delimits the illuminated region on the reticle. The structure-bearing mask 30 is imaged with the projection objective 20 on to a substrate 40 or a wafer provided with a light-sensitive layer. The projection objective 20 can be designed in particular for the immersion mode of operation. In addition it can have a numerical aperture NA of greater than 0.85, in particular greater than 1.1.

Preferably the dimensions of the lambda/2 plates 310, 320 are so selected that each of those lambda/2 plates 310, 320 can respectively 'conceal' the mirror arrangement 200, that is to say all light rays reflected by the mirror arrangement 200 also pass through the lambda/2 plates 310, 320. Furthermore the lambda/2 plates 310, 320 and the mirror arrangement 200 are preferably so jointly designed that there is no shadowing of the mirror arrangement 200 by the arrangement 300 and thus optimum transmission is achieved.

Figure 2:
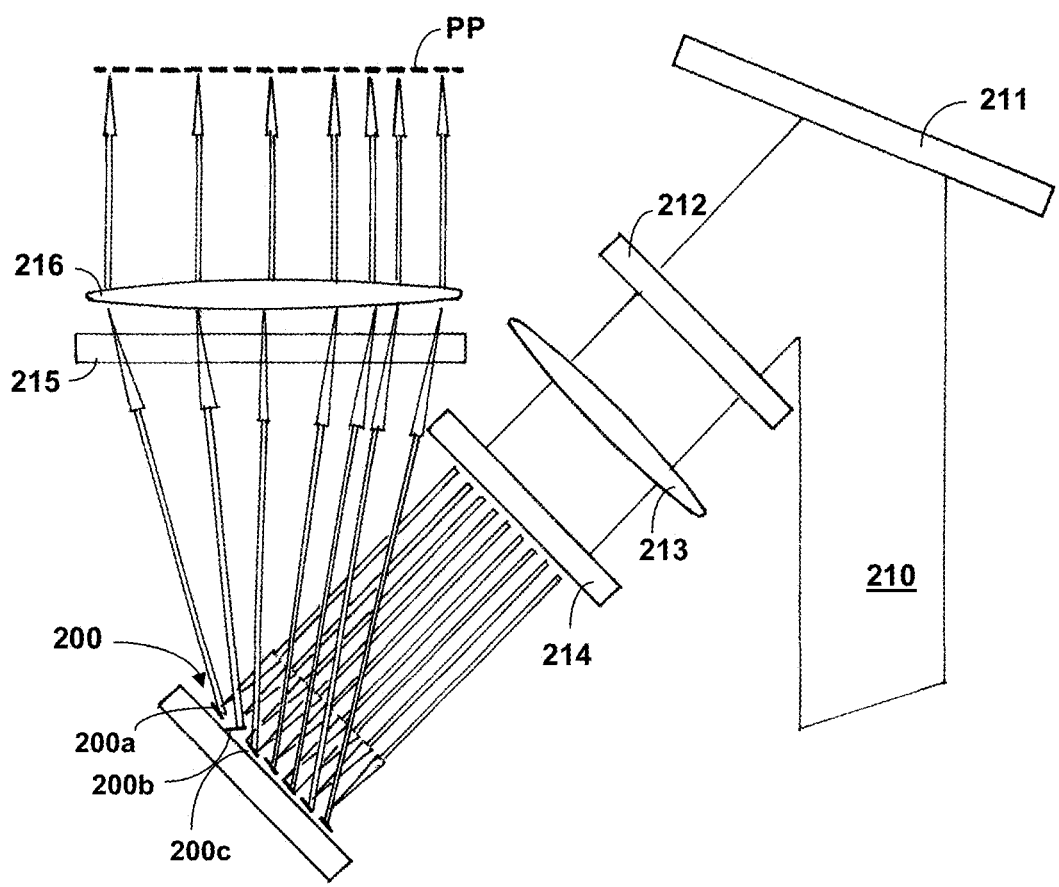
FIG. 2 shows a diagrammatic view to illustrate the structure and function of a mirror arrangement present in the projection exposure apparatus of FIG. 1, FIGS. 3a-f show diagrammatic views to illustrate the mode of operation of a polarization-influencing optical arrangement in accordance with a specific embodiment of the disclosure.

In the structure diagrammatically shown in FIG. 2 the mirror arrangement 200 has a plurality of mirror elements 200a, 200b, 200c, .... The mirror elements 200a, 200b, 200c, are displaceable independently of each other to alter an angular distribution of the light reflected by the mirror arrangement 200, wherein as shown in FIG. 1 there can be an actuation unit 205 for implementing such displacement (for example by way of suitable actuators).

FIG. 2, to illustrate the structure and function of the mirror arrangement 200 used in accordance with the disclosure in the illumination system 10, shows a structure by way of example of a subregion of the illumination system 10 which in the beam path of a laser beam 210 successively includes a deflection mirror 211, a refractive optical element (ROE) 212, a lens 213 (only shown by way of example), a microlens arrangement 214, the mirror arrangement 200 according to the disclosure, a diffuser 215, a lens 216 and the pupil plane PP. The mirror arrangement 200 includes a plurality of micromirrors 200a, 200b, 200c, ..., and the microlens arrangement 214 has a plurality of microlenses for targeted focusing on to those micromirrors and for reducing or avoiding illumination of 'dead area'. The micromirrors 200a, 200b, 200c can be respectively tilted individually, for example in an angular range of between −2° and +2°, in particular between −5° and +5°, further particularly between −10° and +10°. A desired light distribution, for example an annular illumination setting or also a dipole setting or a quadrupole setting can be produced in the pupil plane PP by a suitable tilting arrangement of the micromirrors 200a, 200b, 200c, . . . in the mirror arrangement 200, insofar as the previously homogenized and collimated laser light is respectively deflected in the desired direction depending on the desired illumination setting by the micromirrors 200a, 200b, 200c, . . .

Figure 3A:
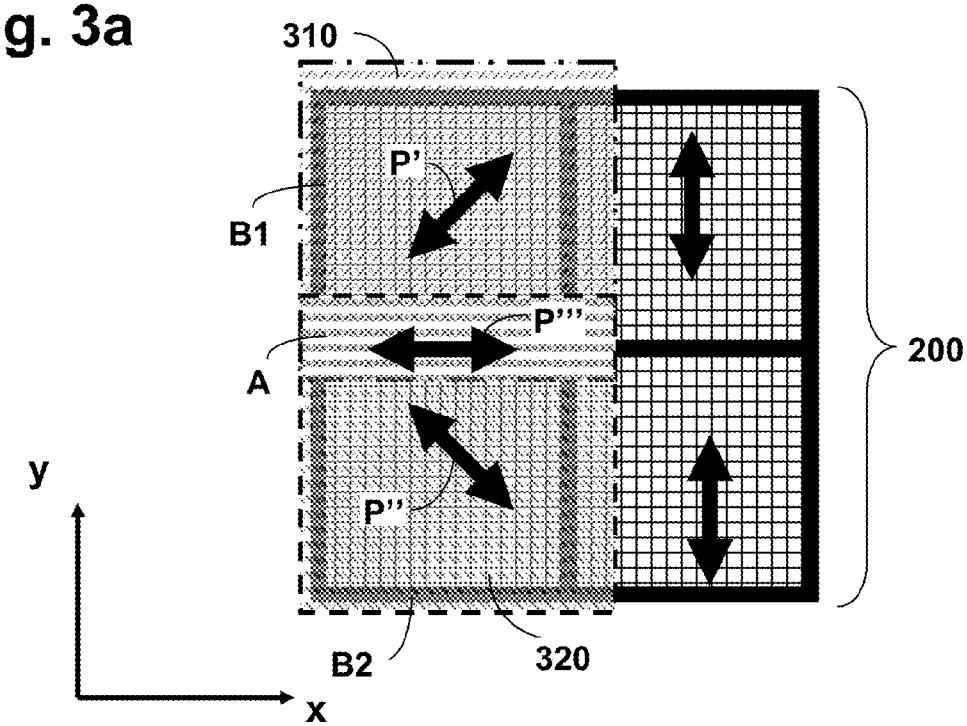
Figure 3B:
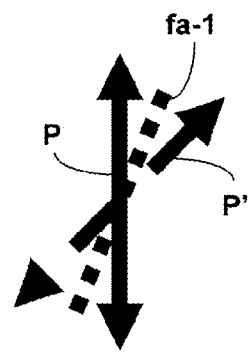

FIG. 3a is a diagrammatic view showing the polarization-influencing optical arrangement 300 in accordance with an embodiment of the disclosure. In the embodiment the polarization-influencing optical arrangement 300 includes mutually partially overlapping lambda/2 plates 310, 320 which are each made from a suitable birefringent material of a transparency which is adequate at the desired working wavelength, for example magnesium fluoride ($MgF_2$), sapphire ($Al_2O_3$) or crystalline quartz ($SiO_2$). In addition the lambda/2 plates 310, 320 (without the disclosure being restricted thereto) are each of a rectangular geometry for adaptation to the geometry of the mirror arrangement 200.

FIG. 3a also shows, for the situation involving incoming radiation of linearly polarized light with a constant preferential polarization direction P extending in the y-direction, the preferential polarization directions respectively occurring after light passes through the polarization-influencing optical arrangement 300. In that respect the respectively resulting preferential polarization direction for the first non-overlap region 'B1' (that is to say the region which is only concealed by the first lambda/2 plate 310) is denoted by P', for the second non-overlap region 'B2' (that is to say the region only concealed by the second lambda/2 plate 320) that is denoted by P''', and for the overlap region 'A' (that is to say the region concealed both by the first lambda/2 plate 310 and also the second lambda/2 plate 320) that is denoted by P'''.

The occurrence of the respective preferential polarization directions in the above-indicated regions is diagrammatically shown in FIGS. 3b-e, wherein the respective position of the fast birefringent axis (which extends in the direction of a high refractive index) for the first lambda/2 plate 310 is indicated by the broken line 'fa-1' while for the second lambda/2 plate 320 it is indicated by the broken line 'fa-2'. In the illustrated embodiment the fast axis 'fa-1' of birefringence of the first lambda/2 plate 310 extends at an angle of 22.5°±2° relative to the preferential polarization direction P of the light beam incident on the arrangement 300 (that is to say relative to the y-direction) and the fast axis 'fa-2' of the birefringence of the second lambda/2 plate 320 extends at an angle of −22.5°±2° relative to the preferential polarization direction P of the light beam incident on the arrangement 300.

Figure 3C:
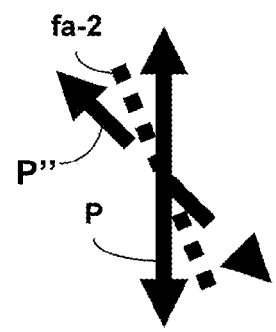
Figure 3D:
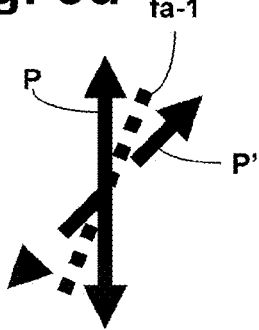
Figure 3E:
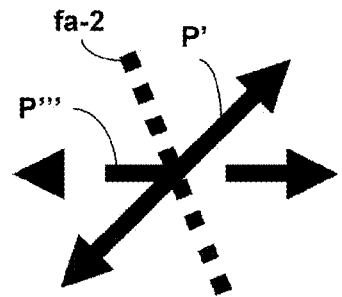

The preferential polarization direction P' occurring after light passes through the first lambda/2 plate 310 corresponds to mirroring of the original (entrance) preferential polarization direction P at the fast axis 'fa-1' (see FIG. 3b) and the preferential polarization direction P'' occurring after light passes through the second lambda/2 plate 320 corresponds to a mirroring of the original (entrance) preferential polarization direction P at the fast axis 'fa-2' (see FIG. 3c). The preferential polarization directions P' and P'' respectively occurring after light passes through the non-overlap regions 'B-1' and 'B-2' consequently extend at an angle of ±45° relative to the preferential polarization direction P of the light beam incident on the arrangement 300.

For the light beam incident on the arrangement 300 in the overlap region 'A', the preferential polarization direction P' of the light beam issuing from the first lambda/2 plate 310 (see FIG. 3d) corresponds to the entrance polarization distribution of the light beam incident on the second lambda/2 plate 320 so that the preferential polarization direction, identified by P''' in FIG. 3a, of the light beam issuing from the overlap region 'A', extends at an angle of 90° relative to the preferential polarization direction P of the light beam incident on the arrangement 300.

The disclosure is not restricted to lambda/2 plates which are displaceable relative to each other. Thus, differently polarized illumination settings can already be set with a static implementation of the lambda/2 plates, by utilising the displaceability of the mirror elements of the mirror arrangement. For example, it is possible to switch over between a quasi-tangential polarization distribution and a quasi-radial polarization distribution by for example deflecting the light components rotated in their polarization direction through 90° by the arrangement 300 being guided into the pupil plane either at '12:00' o'clock and '6:00' o'clock or at '3:00' o'clock and '9:00' o'clock.

Although in the illustrated embodiment both lambda/2 plates 310, 320 are arranged upstream of the mirror arrangement 200 with respect to the light propagation direction the disclosure is not restricted thereto. Thus in further embodiments it is also possible for one of the lambda/2 plates 310, 320 to be arranged upstream of the mirror arrangement with respect to the light propagation direction and for the other to be arranged downstream of the mirror arrangement 200, or it is also possible for both lambda/2 plates 310, 320 to be arranged downstream of the mirror arrangement 200. The last-mentioned configuration has the advantage in that respect that an (exit) polarization distribution set by the arrangement 300 is no longer altered by reflection at the mirror arrangement 200.

The placement of the lambda/2 plates 310, 320 and the spacing thereof relative to the mirror arrangement 200 are also respectively to be so selected that the light components incident on the individual mirrors of the mirror arrangement 200 are defined in respect of the polarization state in such a way that the light reflected at a respective one of the mirrors of the mirror arrangement 200 is acted upon with one defined polarization state—and not for example with two or more mutually different polarization states.

Figure 3F:
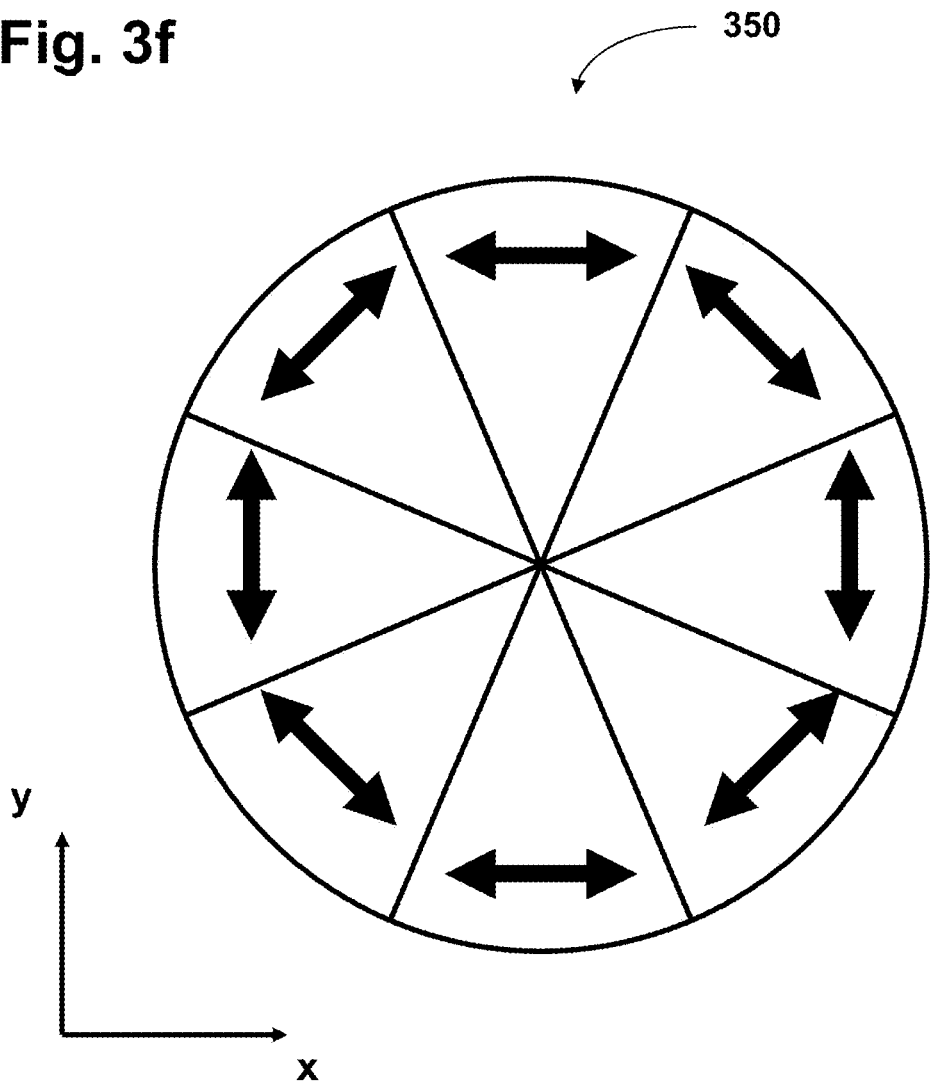

An example of a polarization distribution which can be set with the arrangement of FIG. 3a is shown in FIG. 3f. The polarization distribution produced in accordance with FIG. 3f is a quasi-tangential polarization distribution 350 with eight regions in the shapes of segments of a circle, in which the polarization direction in each case extends constantly and at least approximately tangentially, that is to say perpendicularly to the radius directed towards the optical axis (which extends in the z-direction). The polarization distribution in the respective regions in the shapes of segments of a circle is afforded by virtue of the fact that the polarization direction, as described hereinbefore, was rotated through 0°, 45°, −45° and 90° respectively relative to the polarization direction of the light incident on the arrangement 300. The polarization distribution 350 makes it possible to further operate for example production processes which have been optimized via the OPC process (OPC="optical proximity correction"="optical near field correction") to a quasi-tangential illumination setting, in which respect however it is also additionally possible to use for example an illumination setting with a quasi-tangential polarization distribution in illumination poles rotated through 45°.

A possible further example of use of the arrangement 300 is described with reference to FIGS. 4a-b. In this case, in the structure of FIG. 1, in addition to the arrangement 300 a further polarization manipulator 400 is disposed in the pupil plane (the view in FIG. 4a only represents a diagrammatic sketch as the polarization manipulator 400 is disposed downstream of the arrangement 300 in the light propagation direction). That further polarization manipulator 400 is known from WO 2005/069081 A2 and is diagrammatically shown in FIG. 4b. The polarization manipulator 400 is made from optically active material (in particular crystalline quartz with the crystal axis extending along the light propagation direction) and has a thickness profile varying in the light propagation direction. The polarization manipulator 400 has a hole 405 in a central region and, as described in WO 2005/069081 A2, produces a tangential polarization distribution in the region outside the hole 405 by virtue of the thickness profile and circular birefringence.

Figure 4A:
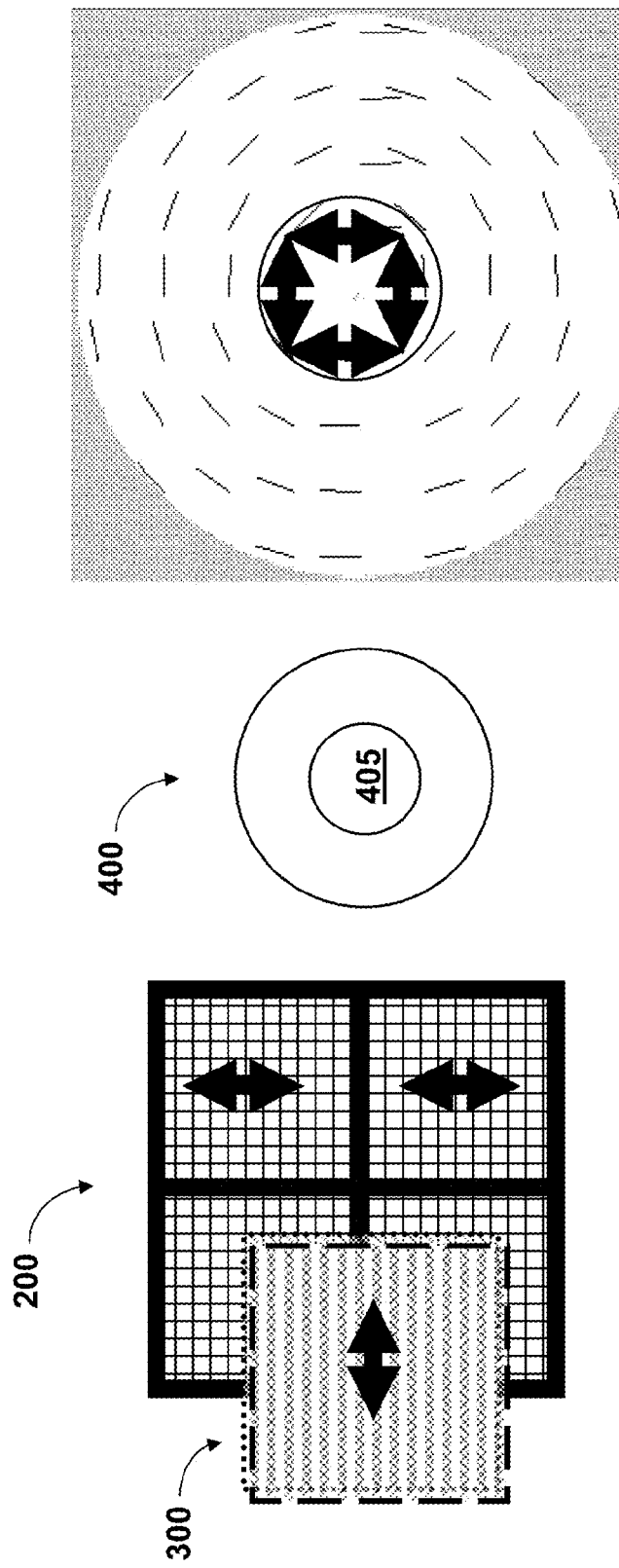
FIGS. 4a-b show diagrammatic views to illustrate a further example of use of the polarization-influencing optical arrangement of FIG. 2, FIGS. 5a-c show diagrammatic views of further polarization distributions which can be set according to the disclosure.
Figure 4B:
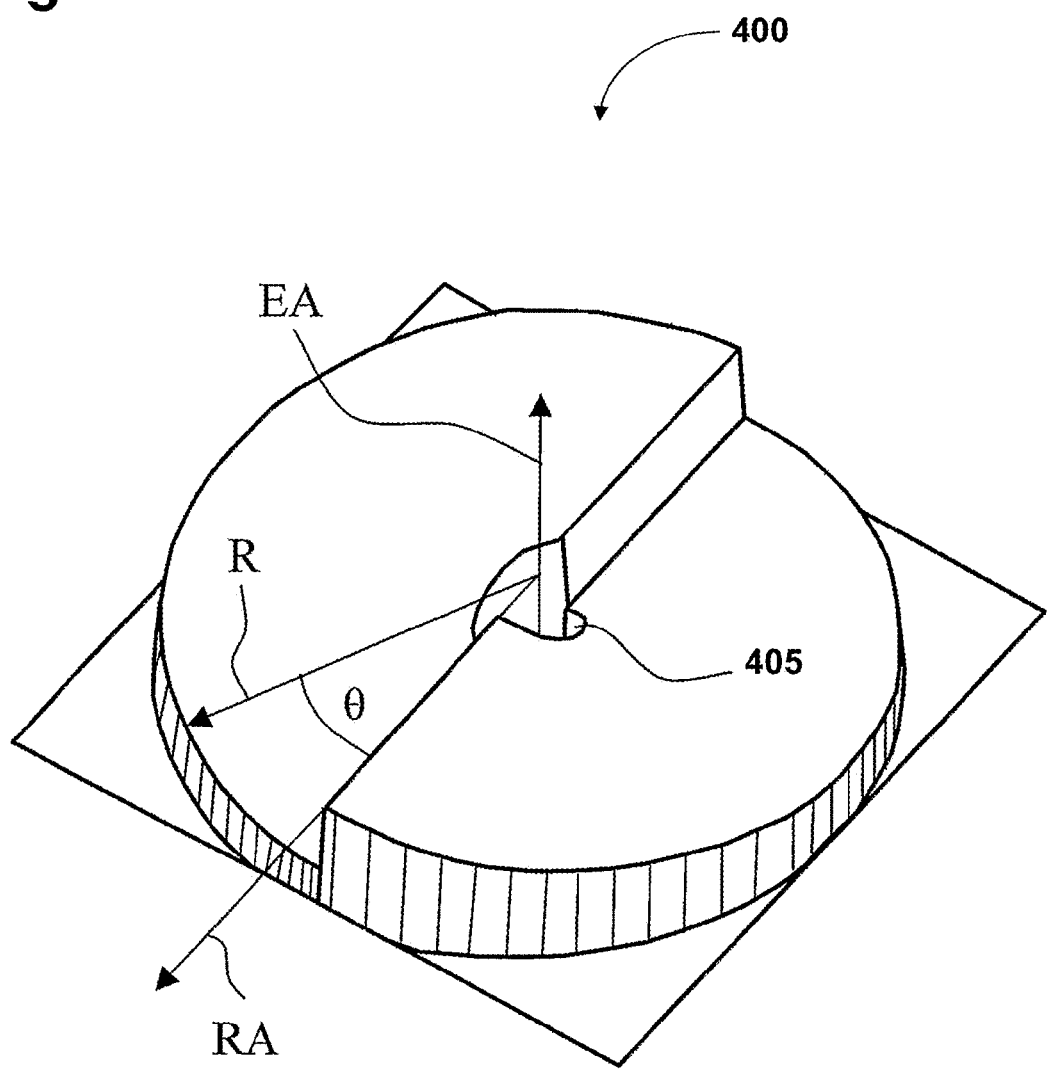

In the FIG. 4a example the two lambda/2 plates 310 and 320 of the arrangement 300 in mutually superposed relationship conceal only a comparatively small part of the mirror arrangement 200 (that is to say only a small part of the total light reflected at the mirror arrangement 200 also passes through the lambda/2 plates 310 and 320). In accordance with the principle described hereinbefore with reference to FIG. 3a, quasi-tangential polarization is involved for that light component which at the same time also passes through the hole 405 of the polarization manipulator 400. That polarization is on the one hand formed from a region with y-polarization for light which passes through the region not covered by the lambda/2 plates 310, 320 and the hole 405 of the polarization manipulator 400 as none of the lambda/2 plates 310, 320 is arranged in the regions of the polarization distribution occurring after light passes through the arrangement 400 and thus there the preferential polarization direction corresponds to the original preferential polarization direction (that is to say the y-direction). In addition, a region with x-polarization is produced by virtue of the action of the two lambda/2 plates 310, 320, that is to say for light which passes through the region covered by the two lambda/2 plates 310, 320 as well as the hole of the polarization manipulator 400.

Tangential polarization distribution is set in an outside region of the pupil plane (for which the mirror arrangement 200 is not covered by the arrangement 300 and for light which passes through the region of the polarization manipulator 400 outside the hole 405).

Figure 5A:
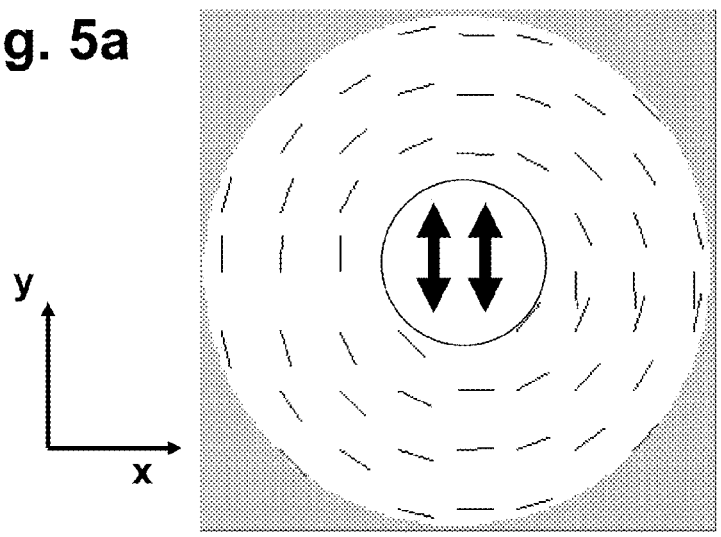
Figure 5B:
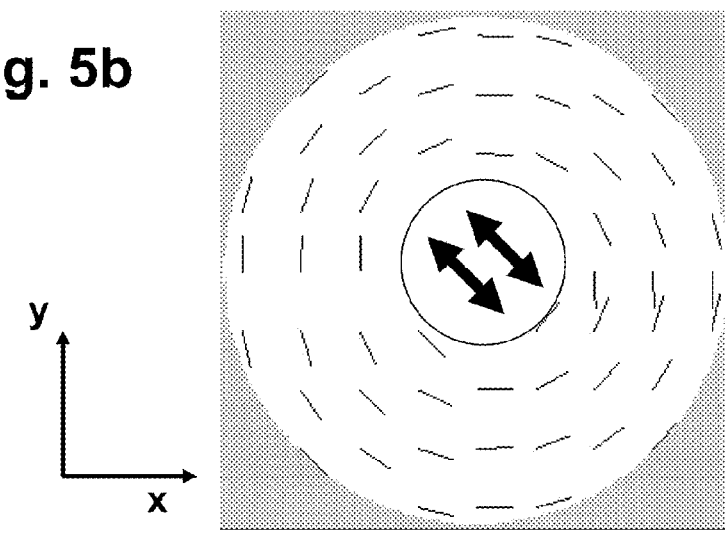
Figure 5C:
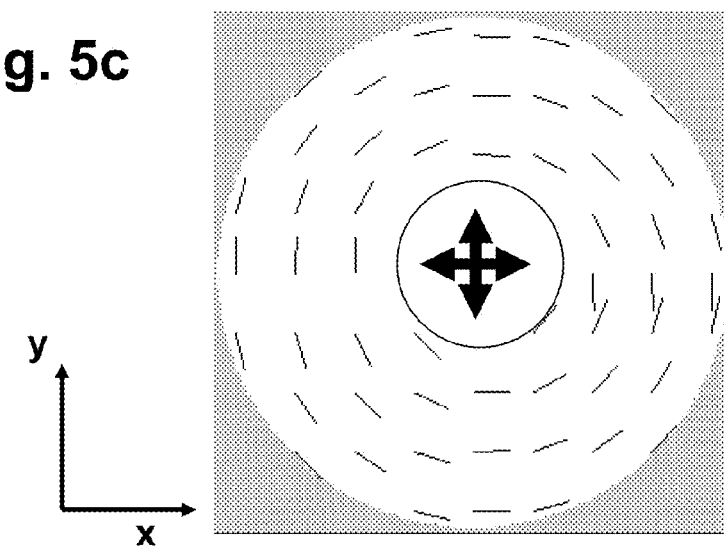

FIGS. 5*a-c* show further examples of polarization distributions which can be set according to the disclosure. Depending on the respective setting of the lambda/2 plates 310, 320 those and other polarization distributions can also be flexibly set without the polarization-influencing optical arrangement 300 having to be exchanged for the change between those illumination settings.

In that respect as shown in FIGS. 5*a* and 5*b* the polarization distributions each have a constantly linear polarization direction in a central region of the pupil plane or for light which passes through the region of the polarization manipulator 400 within the hole 405, wherein that polarization direction in FIG. 5*a, b* was set differently by way of the combination of the mirror arrangement 200 and the polarization-influencing arrangement 300. In the example shown in FIG. 5*c*, mutually perpendicularly polarized light components (with x-polarization and y-polarization) can also be in mutually superposed relationship in order by that superpositioning to produce unpolarized light in a central region or for light which passes through the region of the polarization manipulator 400 within the hole 405.

Figure 6:
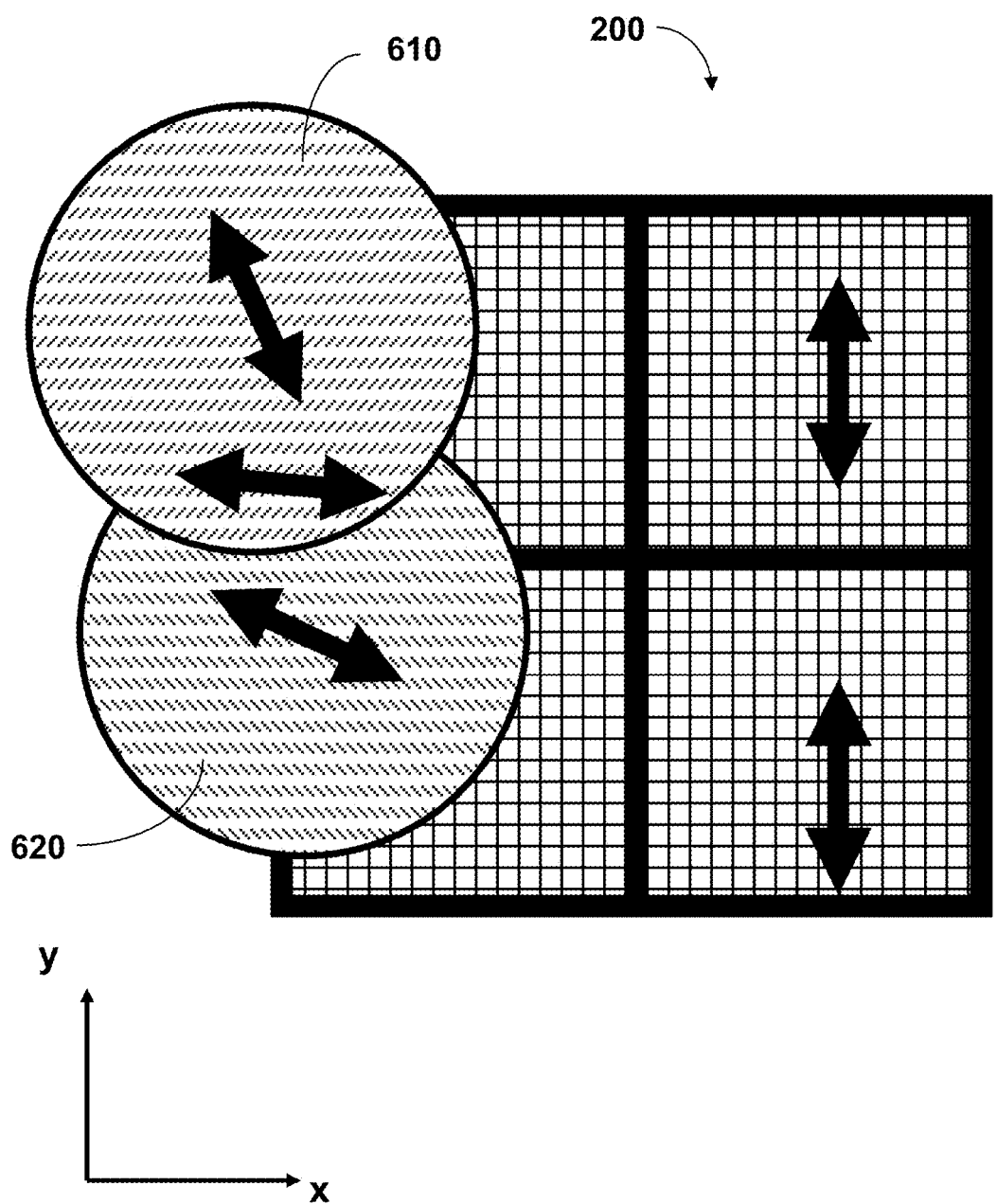
FIG. 6 shows a diagrammatic view to illustrate a polarization-influencing optical arrangement according to a further embodiment of the disclosure.

FIG. 6 shows as a further embodiment an arrangement of two rotatable lambda/2 plates 610 and 620. Actuators for rotation of the lambda/2 plates 610 and 620 can be of any desired configuration, for example in the form of belt drives, solid-state hinge elements, piezoelectric actuators or combinations of those known components.

Here there is the advantage that two polarization states with any desired preferential polarization direction can be set by way of the two rotatable lambda/2 plates 610 and 620.

In the overlap region of the lambda/2 plates 610 and 620 there is a further third polarization state arising out of the combined action of the two lambda/2 plates 610 and 620 similarly to FIG. 3.

Figure 7:
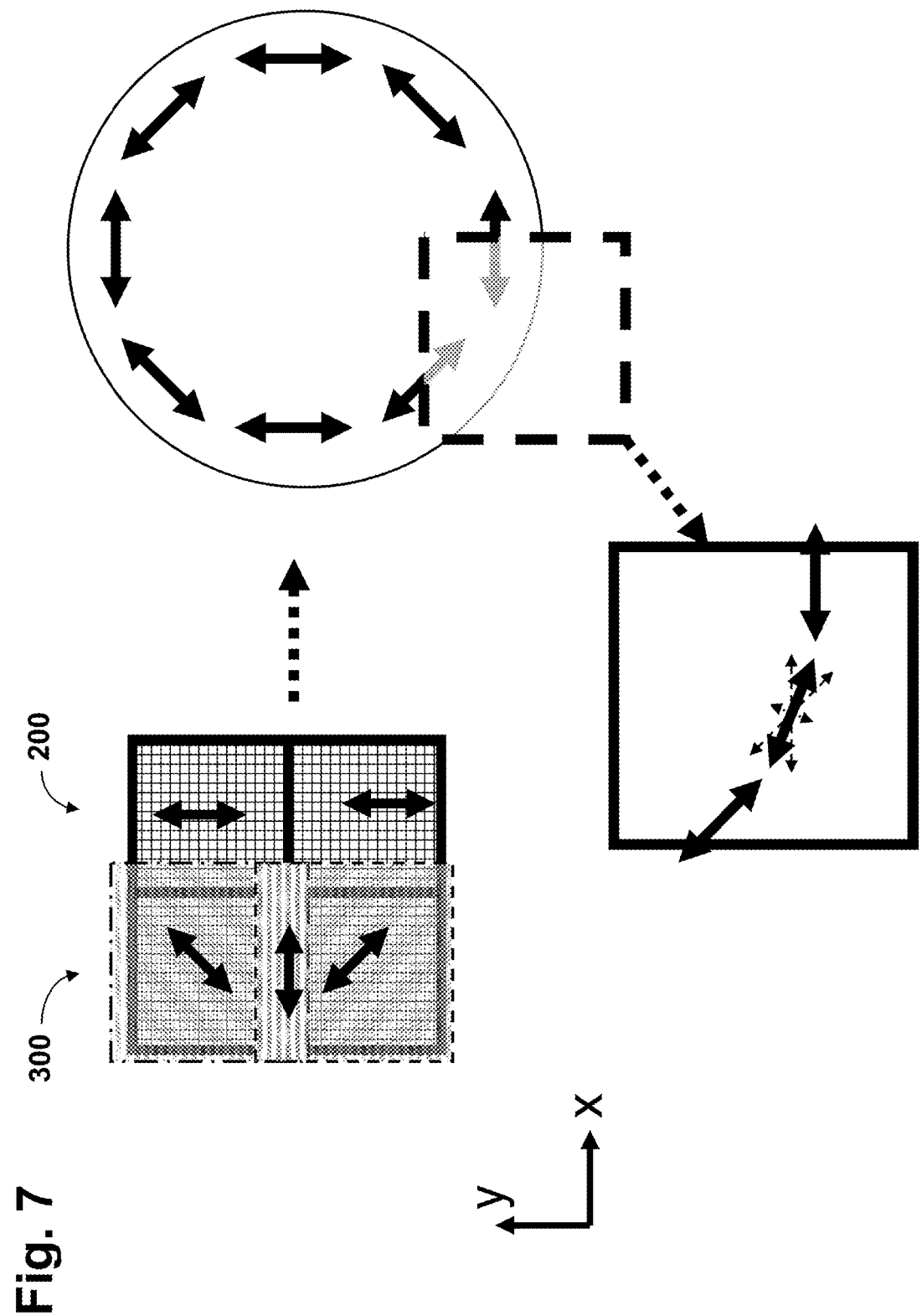
FIGS. 7-9 show diagrammatic views to illustrate further examples of use of a polarization-influencing optical arrangement according to a further embodiment of the disclosure.

In accordance with further embodiments light components which are reflected by the mirrors and which involve different polarization directions as a consequence of the action of the polarization-influencing arrangement 300 can also be in mutually superposed relationship. Such an embodiment which is diagrammatically shown in FIG. 7 is based on the consideration that for example a resultant polarization direction at 22.5° is afforded by superpositioning (indicated in the lower right part of FIG. 7) of the polarization directions 0° and 45° (in each case with respect to the x-axis in the illustrated co-ordinate system), in accordance with vector addition. Corresponding superpositioning can also be effected continuously or with continuously varying intensity components of light involving different polarization directions so that the illumination setting which is ultimately produced has a continuous transition between the adjacent polarization directions. In other words the mirror arrangement is used to achieve a (quasi-)continuous polarization setting by the superpositioning of discrete polarization states.

In regard to the above-described superpositioning it is to be noted that there is an unpolarized contribution on the basis of the mutually adding orthogonally polarized light components, which leads to a reduction in the IPS value which can be achieved. In that respect the term IPS value is used to denote the degree of implementation of a desired polarization state at a given location. In that respect IPS is the abbreviation for 'intensity in preferred state' and the IPS value gives the energetic relationship of the light intensity in the reference direction (which for example can be measured with an ideal polarizer, the transmission direction of which is set in the reference direction), relative to the overall intensity. In quantitative terms, starting from FIG. 7, that is to say in the production of a total of eight polarization states, via the combination of the polarization-influencing optical arrangement and the mirror arrangement, there is an IPS value of about 96% for the case of superpositioning of the polarization directions 0° and 22.5°. For comparison purposes, starting from FIG. 3, that is to say when producing a total of four polarization states, via the combination of the polarization-influencing optical arrangement and the mirror arrangement, there is an IPS value of about 85% for the case of superpositioning of the polarization directions 0° and 45°.

In accordance with further embodiments described hereinafter with reference to FIG. 8 and FIG. 9 the optical system can also have more than two lambda/2 plates. In general the present disclosure embraces arrangements with any number (≥2) of lambda/2 plates with any orientation of the fast axis of birefringence.

Figure 8:
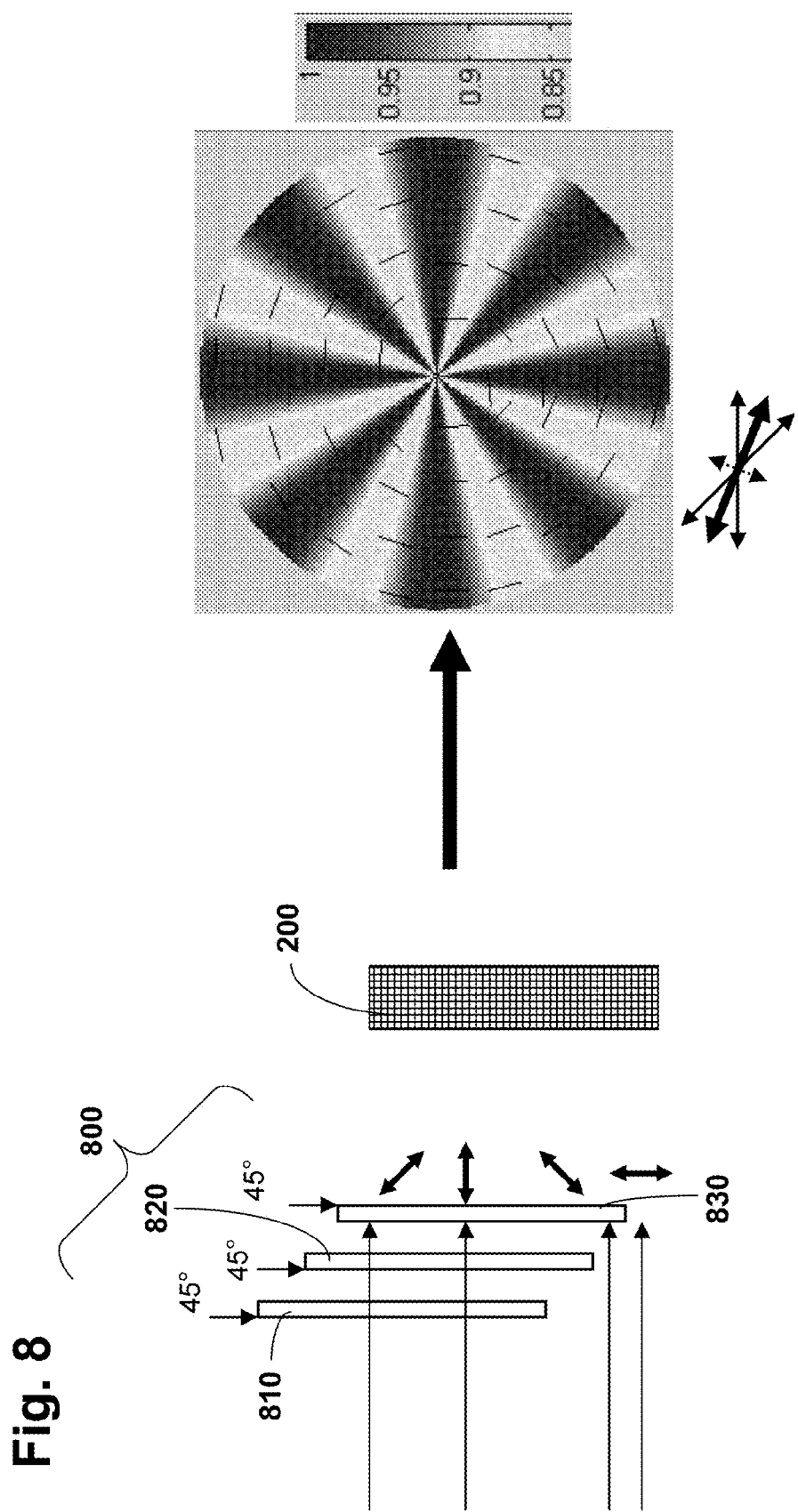

Referring to FIG. 8 the use of three lambda/2 plates 810, 820, 830 makes it possible to set four polarization states which differ stepwise through 45° respectively in terms of the respectively produced exit polarization direction. As can be seen from the right-hand part of FIG. 8 a continuous polarization distribution can again be achieved by the above-described superpositioning as the intensity ratio between the light components respectively reflected by two mirrors with respectively different 'associated' polarization states is continuously altered by way of the azimuth angle and thus the polarization direction is rotated.

The orientations of the lambda/2 plates, which are set for the embodiment in FIG. 8, and the respectively produced polarization directions, are shown in Table 1.

TABLE 1

| Plate m | Rotary angle (°) | Fast axis (°) | Polarization downstream of the plate (°) |
|---|---|---|---|
| 0 | | | 0 |
| 1 | 45 | 22.5 | 45 |
| 2 | 45 | 67.5 | 90 |
| 3 | 45 | 112.5 | 135 |

Figure 9:
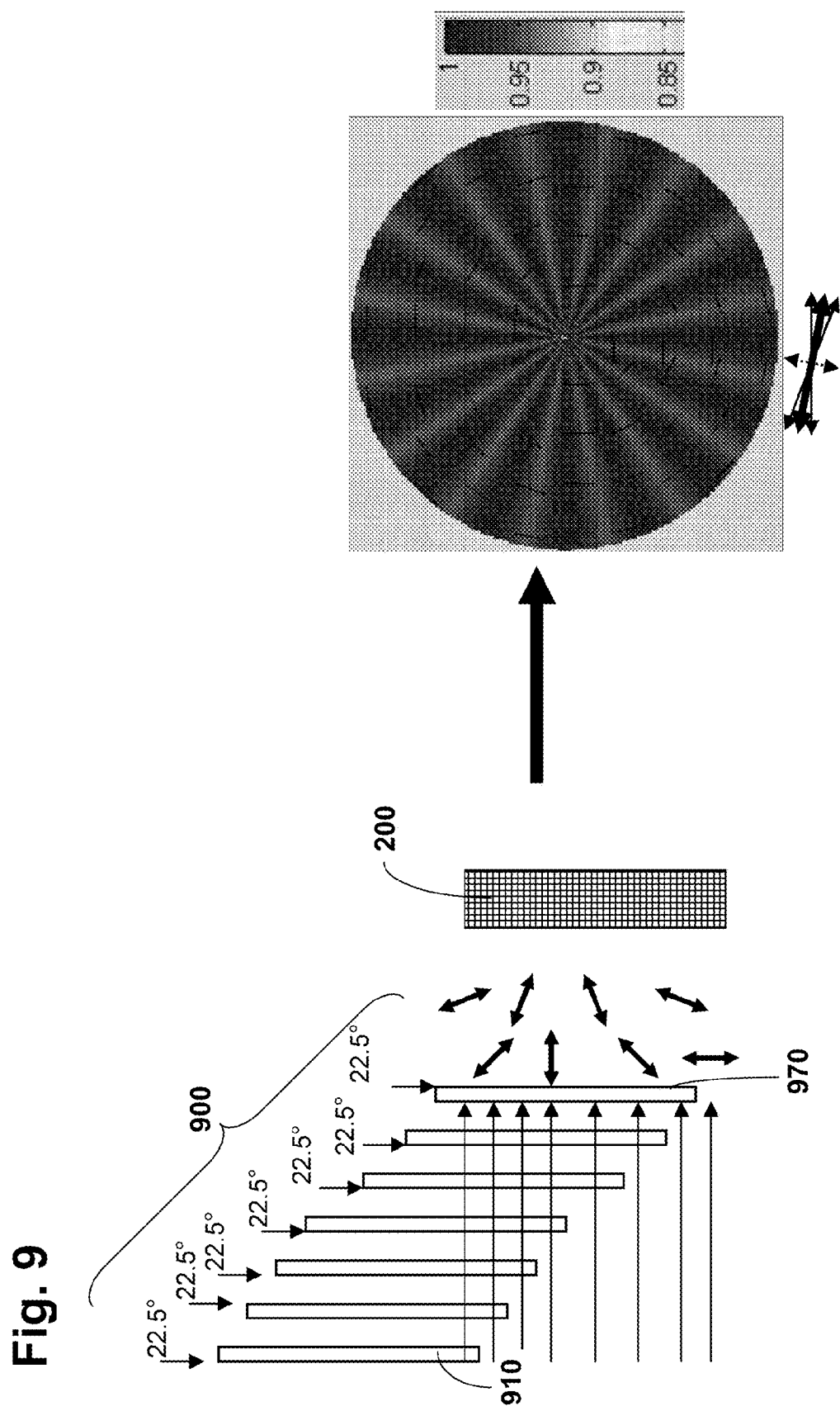

Referring to FIG. 9 using seven lambda/2 plates 910, 920, 930, . . . makes it possible to set eight polarization states which differ stepwise each through 22.5° in respect of the respectively produced exit polarization direction or in which the polarization direction of the light beam issuing from the respective lambda/2 plate extends at an angle which is an integral multiple of 22.5°. In specific terms, in the first lambda/2 plate 910 the fast axis extends at an angle of 11.25° to the preferential polarization direction P of the light beam incident on the arrangement 900 while in the second lambda/2 plate 920 the fast axis extends at an angle of 11.25°±22.5° relative to the preferential polarization direction P of the light beam incident on the arrangement 900 and in the n-th lambda/2 plate the fast axis extends at an angle of 11.25°+(n−1)*22.5° relative to the preferential polarization direction P of the light beam incident on the arrangement 900.

In other words, in each of the lambda/2 plates 910, 920, 930, . . . the fast axis of birefringence respectively extends at an angle of 11.25° relative to the preferential polarization direction P of the light beam respectively incident on the lambda/2 plate in question so that each rotational angle through a further 22.5° is afforded as a consequence of mirroring at the respective fast axis.

The orientations of the lambda/2 plates, which are set for the FIG. 9 embodiment, as well as the respectively achieved polarization directions, can be seen in Table 2.

TABLE 2

| Plate m | Rotary angle (°) | Fast axis (°) | Polarization downstream of the plate (°) |
|---|---|---|---|
| 0 | | | 0 |
| 1 | 22.5 | 11.25 | 22.5 |
| 2 | 22.5 | 33.75 | 45 |
| 3 | 22.5 | 56.25 | 67.5 |
| 4 | 22.5 | 78.75 | 90 |
| 5 | 22.5 | 101.25 | 112.5 |
| 6 | 22.5 | 123.75 | 135 |
| 7 | 22.5 | 146.25 | 157.5 |

In this case also as a result a continuous polarization distribution can again be achieved by the above-described superpositioning, wherein a comparatively high IPS value (in the example an IPS value of about 96%) can be achieved as for example in comparison with the arrangement of FIG. 7, it is possible to reduce the proportion of depolarization as a consequence of superpositioning of the orthogonal polarization states.

In general terms with a number n of lambda/2 plates the rotary angle of each lambda/2 plate is selected as $360°/(n+1)/2$, wherein the fast axes are each differently oriented and wherein the orientation of the fast axis of the m-th lambda/2 plate is given as $(m-1)*360°/(n+1)/2+360°/(n+1)/4$. The polarization rotation downstream of the m-th lambda/2 plate is then $(m)*360°/(n+1)/2$.

The lambda/2 plates in the embodiments described with reference to FIGS. 8 and 9 can be arranged displaceably in their relative position with respect to each other, similarly to the previously described embodiments. In that respect reference is directed to the preceding description in relation to FIG. 3 ff.

Even if the disclosure has been described by using specific embodiments numerous variations and alternative embodiments will be apparent to the man skilled in the art, for example by the combination and/or exchange of features of individual embodiments. Accordingly the man skilled in the art will appreciate that such variations and alternative embodiments are also embraced by the present disclosure and the scope of the disclosure is limited only in the sense of the accompanying claims and equivalents thereof.

What is claimed is:

1. An optical system, comprising:
   a mirror arrangement comprising a plurality of mirror elements which are displaceable independently of each other to alter an angular distribution of light reflected by the mirror arrangement during use of the optical system; and
   a polarization-influencing optical arrangement comprising a first lambda/2 plate and a second lambda/2 plate, wherein:
   the first and second lambda/2 plates are arranged in succession along a light path that the light follows through the optical system during use of the optical system;
   the first and second lambda/2 plates are upstream of a pupil plane along the light path that light follows through the optical system during use of the optical system;
   the first and second lambda/2 plates are displaceable relative to each other; and
   the optical system is configured to be used in a microlithographic projection exposure apparatus.

2. The optical system of claim 1, wherein the first and second lambda/2 plates are translatable relative to each other.

3. The optical system of claim 1, wherein the first and second lambda/2 plates are rotatable relative to each other.

4. The optical system of claim 1, wherein the first and second lambda/2 plates are translatable in mutually different spatial directions.

5. The optical system of claim 1, wherein the first and second lambda/2 plates are displaceable relative to each other with a degree of overlap which is variable in the light propagation direction.

6. The optical system of claim 1, wherein the first lambda/2 plate is displaceable between a first position in which the first lambda/2 plate is completely outside an optically effective region of the mirror arrangement and a second position in which the first lambda/2 plate is disposed completely within the optically effective region of the mirror arrangement.

7. The optical system of claim 1, wherein the first lambda/2 plate has a fast axis of birefringence, the second lambda/2 plate has a fast axis of birefringence, and an orientation of the fast axis of birefringence of the first lambda/2 plate is different from an orientation of the fast axis of the second lambda/2 plate.

8. The optical system of claim 1, wherein a fast axis of birefringence of the first lambda/2 plate and a fast axis of the second lambda/2 plate are arranged at an angle of 45° ±5° relative to each other.

9. The optical system of claim 1, wherein a vibration plane of a first linearly polarized light beam which passes only through the first lambda/2 plate during use of the optical system is rotated through a rotary angle, a vibration plane of a second linearly polarized light beam which passes only through the second lambda/2 plate during use of the optical system is rotated through a second angle, and the first angle is different from the second angle.

10. The optical system of claim 9, wherein the first and second angles have the same absolute value but opposite signs.

11. The optical system of claim 1, wherein the first and second lambda/2 plates define 90° rotator in an overlap region with each other.

12. The optical system of claim 1, wherein the polarization-influencing optical arrangement comprises precisely two lambda/2 plates.

13. The optical system of claim 1, wherein the polarization-influencing optical arrangement comprises a third lambda/2 plate.

14. The optical system of claim 1, wherein the polarization-influencing optical arrangement is adjustable so that, during use of the optical system, the optical system converts a linear polarization distribution with a preferential polarization direction which is constant over a cross-section of a light beam into an approximately tangential polarization distribution.

15. The optical system of claim 1, further comprising a polarization-influencing optical element comprising an optically active material having a varying thickness profile.

16. An apparatus, comprising:
an illumination system; and
a projection objective,
wherein the illumination system and/or the projection objective comprises an optical system according to claim 1, and apparatus is a microlithographic projection exposure apparatus.

17. A method, comprising:
using an illumination system of a microlithographic projection exposure apparatus to illuminate a mask comprising structures; and
using a projection objective of the microlithographic projection exposure apparatus to image the structures of the mask onto a light-sensitive material,
wherein the illumination system and/or the projection objective comprises an optical system according to claim 1.

18. The optical system of claim 1, wherein neither first lambda/2 plate nor the second lambda/2 plate is downstream of the mirror arrangement along the light path that light follows through the optical system during use of the optical system.

19. A method of operating a microlithograpic projection exposure apparatus comprising an illumination system and a projection objective, the illumination system comprising a mirror arrangement and a polarization-influencing optical arrangement, the mirror arrangement comprising a plurality of mirror elements which are displaceable independently of each other to alter an angular distribution of light reflected by the mirror arrangement during use of the optical system, the polarization-influencing optical arrangement comprising first and second lambda/2 plates, the method comprising:
interacting light with the polarization-influencing optical arrangement when the first and second lambda/2 plates have a first relative position to provide a first illumination setting in a pupil plane of the illumination system; and
interacting light with the polarization-influencing optical arrangement when the first and second lambda/2 plates have a second relative position to provide a second illumination setting in the pupil plane of the illumination system,
wherein:
the first relative position is different from the second relative position;
the first and second lambda/2 plates are arranged so that they partially mutually overlap in a light propagation direction forming at least one overlap region and at least one non-overlap region;
the first and second lambda/2 plates are upstream of a pupil plane along a path that light follows through the illumination system during use of the illumination system; and
the first illumination setting in the pupil plane differs from the second illumination setting in the pupil plane.

20. The method of claim 19, wherein both the overlap region and also the non-overlap region are at least partially illuminated.

21. The method of claim 19, wherein at least two beam portions which are reflected by different mirror elements of the mirror arrangement of the illumination system and which have different polarization directions as a consequence of the action of the polarization-influencing arrangement are mutually superposed.

22. The method of claim 19, wherein neither first lambda/2 plate nor the second lambda/2 plate is downstream of the mirror arrangement along the light path that light follows through the optical system during use of the optical system.

23. An optical system, comprising:
a mirror arrangement comprising a plurality of mirror elements which are displaceable independently of each other to alter an angular distribution of light reflected by the mirror arrangement during use of the optical system; and
a polarization-influencing optical arrangement comprising a first lambda/2 plate and a second lambda/2 plate,
wherein:
the first and second lambda/2 plates are arranged in succession along a light path that the light follows through the optical system during use of the optical system;
a fast axis of birefringence of the first lambda/2 plate extends at an angle of 22.5° ±2° relative to a preferential polarization direction of a light beam incident on the polarization-influencing optical arrangement during use of the optical system;
a fast axis of birefringence of the second lambda/2 plate extends at an angle of −22.5° ±2 relative to the preferential polarization direction of the light beam incident on the polarization-influencing optical arrangement during use of the optical system; and
the optical system is configured to be used in a microlithographic projection exposure apparatus.

\* \* \* \* \*